United States Patent [19]

Williams

[11] Patent Number: 4,774,455
[45] Date of Patent: Sep. 27, 1988

[54] METHOD FOR AUTOMATIC GUARD SELECTION IN AUTOMATIC TEST EQUIPMENT

[75] Inventor: Lewis Williams, Dorset, England

[73] Assignee: Membrain Limited, Dorset, England

[21] Appl. No.: 840,297

[22] Filed: Mar. 14, 1986

[30] Foreign Application Priority Data

Mar. 15, 1985 [GB] United Kingdom ................ 8506842

[51] Int. Cl.⁴ ............................................ G01R 31/28
[52] U.S. Cl. ............................ 324/73 R; 324/158 R; 371/15; 371/20
[58] Field of Search ........... 324/73 R, 73 AT, 73 PC, 324/158 R, 158 T; 371/25, 24, 15

[56] References Cited

U.S. PATENT DOCUMENTS

| | | | |
|---|---|---|---|
| 3,931,506 | 1/1976 | Borrelli et al. | 324/73 R X |
| 4,070,565 | 1/1978 | Borrelli | 324/73 R |
| 4,555,783 | 11/1985 | Swanson | 371/15 X |

OTHER PUBLICATIONS

Mesures-Regulation-Automatisme, Nov. 1981, by J-F Peyrucat, pp. 7, 9, 11, 13, 15, 17, 21, 25, 28, 29, 31, 33, 35. "Zero in on Analog Faults with Guarded-Probe ATE Diagnostic", by S. L. Black, Electronic Design, vol. 27, No. 21, (1979).

Primary Examiner—Reinhard J. Eisenzopf
Assistant Examiner—Vinh P. Nguyen
Attorney, Agent, or Firm—Ladas & Parry

[57] ABSTRACT

During the testing of circuit boards with Automatic Test Equipment in some circuit configurations the performance of a component may not be as expected even though it is sound due to the influence of surrounding components. In such a situation guards may be placed, that is further signals via probes contacting nodes other than those to which the component is connected, so that such disruption may be minimized. A method for defining guards during the operation of automatic test equipment so that a selected component of a circuit may be tested includes establishing a measurement of the selected component in a known to be good circuit of the type to be tested. A circuit node associated with the selected component is identified and a guard is applied to the node. A second measurement is established with the selected guard in place. If the guard results in an improvement, it is retained during subsequent automatic testing.

9 Claims, 4 Drawing Sheets

METHOD FOR AUTOMATIC GUARD SELECTION IN AUTOMATIC TEST EQUIPMENT

This invention relates to methods for operating automatic test equipment (ATE) for printed circuit boards (pcbs), and in particular to a method of providing guarding during measurements made by such equipment on the components of circuits on such boards.

In testing printed circuit board components connection is made, normally by activation of a selection of an array of probes, to circuit nodes surrounding a component to be tested. By applying input signals to some nodes and extracting outputs at others, the performance of a component under test may be examined in relation to that expected with a view to declaring that component sound or faulty. In some circuit configurations, the performance of a component may not be as expected even though it is sound due to the influence of surrounding components. In such a situation, it is known to place guards, that is to apply further signals via probes contacting further nodes, so that such distruption may be minimized and a measurement obtained consistent with a sound component.

It is desirable that the testing of pcbs should be automated as far as possible and many ATEs have been devised. An ATE typically comprises a test fixture having controllable probes which can be made to contact selected circuit nodes, signal generators and receivers for applying and extracting signals via the probes, instrumentation for assessing measured signals, and a computer controller for executing a control program devised to test all board components. In advanced ATE the computer provides a test program framework which when provided with circuit layout automatically generates a test program to be executed. Unfortuately such an automatically generated test routine is seldom able to be used without modification, and the final step in devising the test program involves an operator who, running the program as it stands step by step on a known to be good board identifies which sound components are being failed and largely through intuition, trial and error modifies the program until known good boards pass consistently.

Often this manual part of the process involves the placing of guards. Whilst some straightforward guards may be placed by the generator program, most are required because of complex component interaction, and hence can only be posted manually. It will be appreciated that this part of test program derivation can be very time consuming and requires a knowledgeable engineer for its performance rather than simply someone capable of operating ATE.

According to the present invention a method for defining guards during the operation of automatic test equipment so that a selected component of a circuit may be tested includes the steps of:
establishing a measurement of the selected component, identifying a circut node associated with the selected component,
applying a guard to the node, establishing a measurement with the selected guard in place and, should the guard result in an improvement, retaining the guard during subsequent automatic testing.

Preferably all circuit nodes associated with the selected component are identified and a guard applied to each in turn. Advantageously a limited number of guards, being those yielding the greatest improvement, are retained.

In a preferred form of the present invention, retained guards are applied in combination and further measurements performed. Advantageously the best combination is retained. Preferably improvement is assessed with respect to an initial reference being an unguarded or topographically guarded measurement (that is with guards preselected on the basis of circuit description and/or device characteristics). Advantageously components for guarding are selected from components the measurement of which is inconsistent with that expected from a sound component. Where a combination is involved, the measurement may be compensated to degrade the effective impovement where a plurality of guards are employed.

Preferably a component measurement is established by injecting a signal at a first component node and measuring response at a second node. The guard learning process may then be applied. Advantageously the measurement is re-established by injecting a signal at the second node and measurement at the first node and the guarding re-applied so that he best combination may be selected.

In order that features and advantages of the present invention may be further appreciated an embodiment will now be described, by way of example only and with reference to the accompanying diagrammatic drawings, of which:

Figure 1:
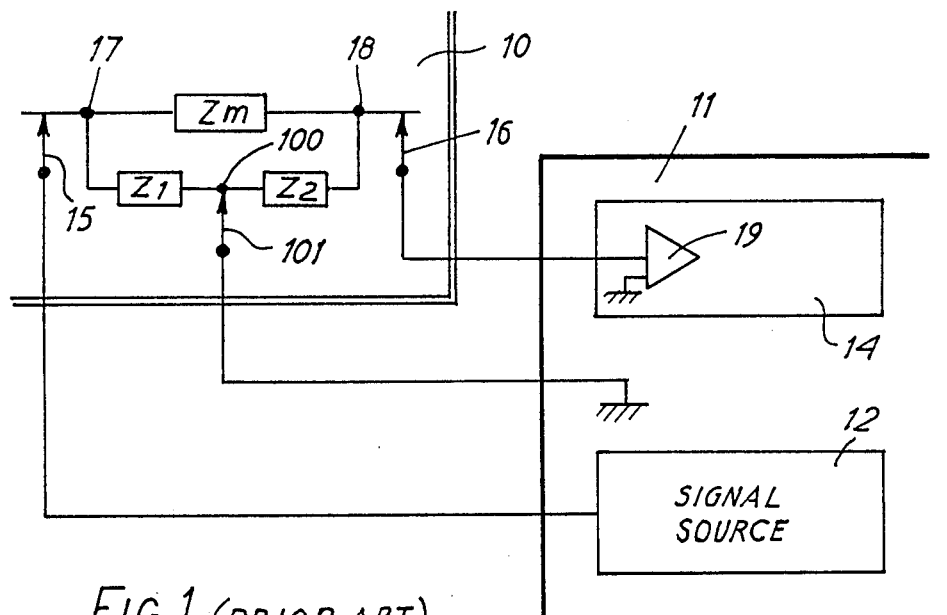
FIG. 1 represents an example of topographical guarding.

In a fragment of a circuit on a pcb 10 (FIG. 1) to be tested a component $Z_m$ is in parallel with series component $Z_1$ and $Z_2$. Part of an ATE 11 provides a signal source 12 and a signal receiver 14, which are connectable via probes 15, 16 contacting circuit nodes 17, 18 respectively. In accordance with known practice component $Z_m$ is to be tested by applying a voltage to node 17 and examining the output of a measurement amplifier 19. It will be appreciated that when the voltage is applied the measurement will not be that expected for $Z_m$ due to the influence of parallel path $Z_1/Z_2$.

The problem may be overcome by placing a guard signal in the form of a ground connection to node 100 between $Z_1$ and $Z_2$ via probe 101. No current now flows through $Z_2$ since node 100 is at ground potential, as is node 18 by virtue of connection to the virtual earth point of measurement amplifier 19. $Z_m$ may now be tested as envisaged above, since neither $Z_1$ nor $Z_2$ contribute to the input to measurement amplifier 19.

Figure 2:
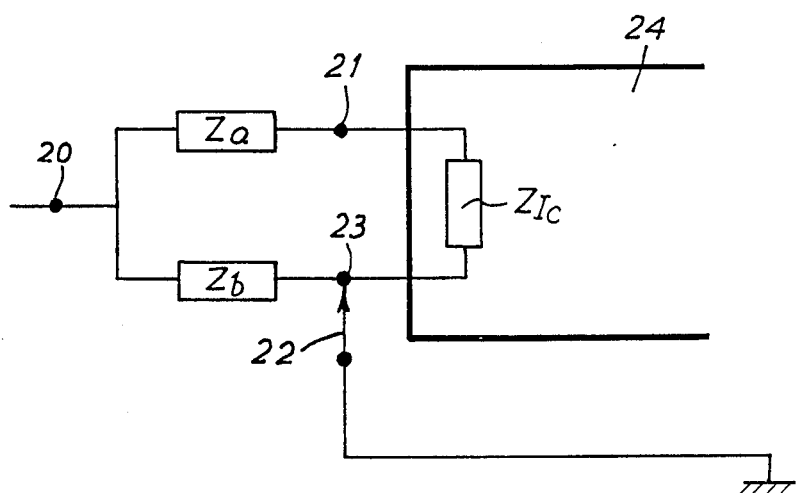
FIG. 2 represents a further example of guarding.

The above elementary example is presented so that the principles of guarding will be understood, and in particular as an example of a guard that may be posted by an automatic generator program of the type known in the prior art. As has been previously discussed, a computer associated with ATE may be equipped to generate a test program for later manual refinement. Typically the first stage of this process is for an operator to load details of circuit topography, expressed for example as a nodal connection chart. The generator program is arranged to examine the chart for parallel paths, such as $Z_m$ and $Z_1/Z_2$ of FIG. 1. Having found such a path a guard selection algorithm may be invoked to place a guard at node 100 when testing Zm.

Where unexpected obtained measurements are due to more complex interactions between circuit components the elementary approach outlined above will not succeed. Attempts to test component $Z_a$ (FIG. 2) by injecting a voltage at node 20 and performing a measurement at node 21 will fail due to parallel path $Z_{IC}$, $Z_b$. The problem may be overcome by placement of a guard 22 at node 23, but it will be noted that since $Z_{IC}$ is due to the internal impedance of integrate circuit device 24, the guard may not be found by topographical analysis. It is guards of this type that must be posted manually when it has been established by an operator that the automatically generated test routine is failing sound components at position $Z_a$.

In order to devise a test program automatically a description of each component must be available to ATE. For common components a library of such descriptions is maintained. Unfortunately the descriptions may not include parameters such as internal impedances, preventing a precise topographical analysis. To extend the descriptions in this respect one would not only face the problem of providing a significant amount of extra storage capacity in ATE, but also that of characterizing many components afresh, since such values are not generally available. As a result of these considerations, operator placement of non-topographic guards during the definition of a test routine remains the preferred prior art method.

The present invention provides a solution to the problem of guard placement and an embodiment will now be described in more detail. A knowledge of ATE and its operation will be assumed, but so that the invention may be appreciated in context, the overall operation of an ATE including the present invention will first be considered.

Figure 3:
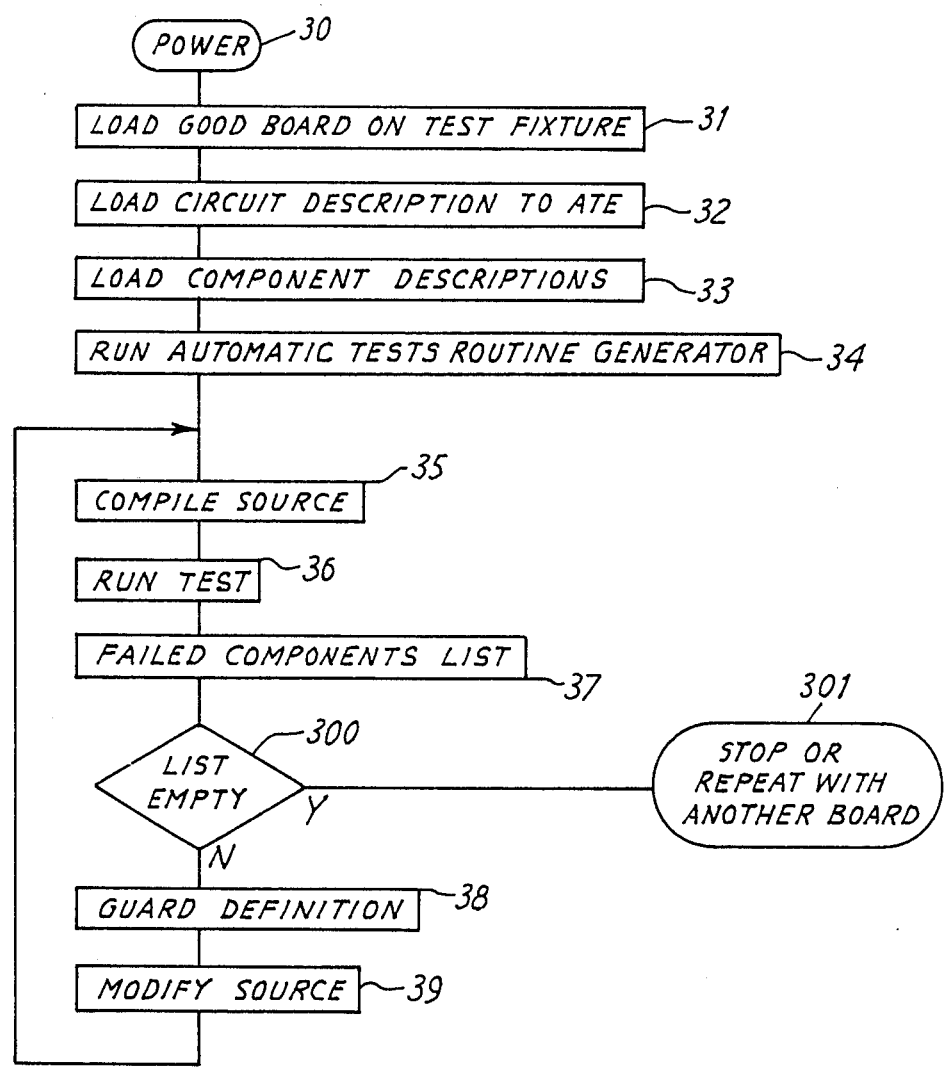
FIG. 3 represents a flow chart of ATE operation.

Following switch on 30 (FIG. 3) a known to be good board of the type to be tested is loaded 31 into the ATE test fixture. The test fixture is that part of the ATE which enables probes to make contact with the circuit under test and the connection of sources, receivers and guards thereto and as such will be familiar to those skilled in the art. A circuit description which precisely defines the interconnection pattern and component location on the board is loaded 32 together with descriptions of the components themselves 33. An automatic test routine generator 34 is then invoked to provide a program to control the testing on the board. Such generation is not part of the present invention, but it will be appreciated that the test generator may be a complex computer program which operates on the loaded data in accordance with test algorithms established for each component. Suffice to say that the eventual output of the generator is a source program which may be compiled 35 to enable the board to be physically tested 36 by the ATE.

In practice due to imperfections in the test procedure the board under test will fail at first attempt, and a list of suspected unsound components be outputted 37. Since the board is known to be good, clearly the source program must be modified. As part of this modification the operator may initiate a guard definition 38 and once guards have been located the source will be modified 39, and recompiled. This may be repeated until all components pass the test run, the failed components list then being empty 300, whereupon the procedure may be stopped 301 or confirmed on another sample good board. Once good boards are consistently passed, the test routine may be frozen and used subsequently to test production boards.

Guard definition, being an object of the present invention will now be considered in further detail.

Figure 4:
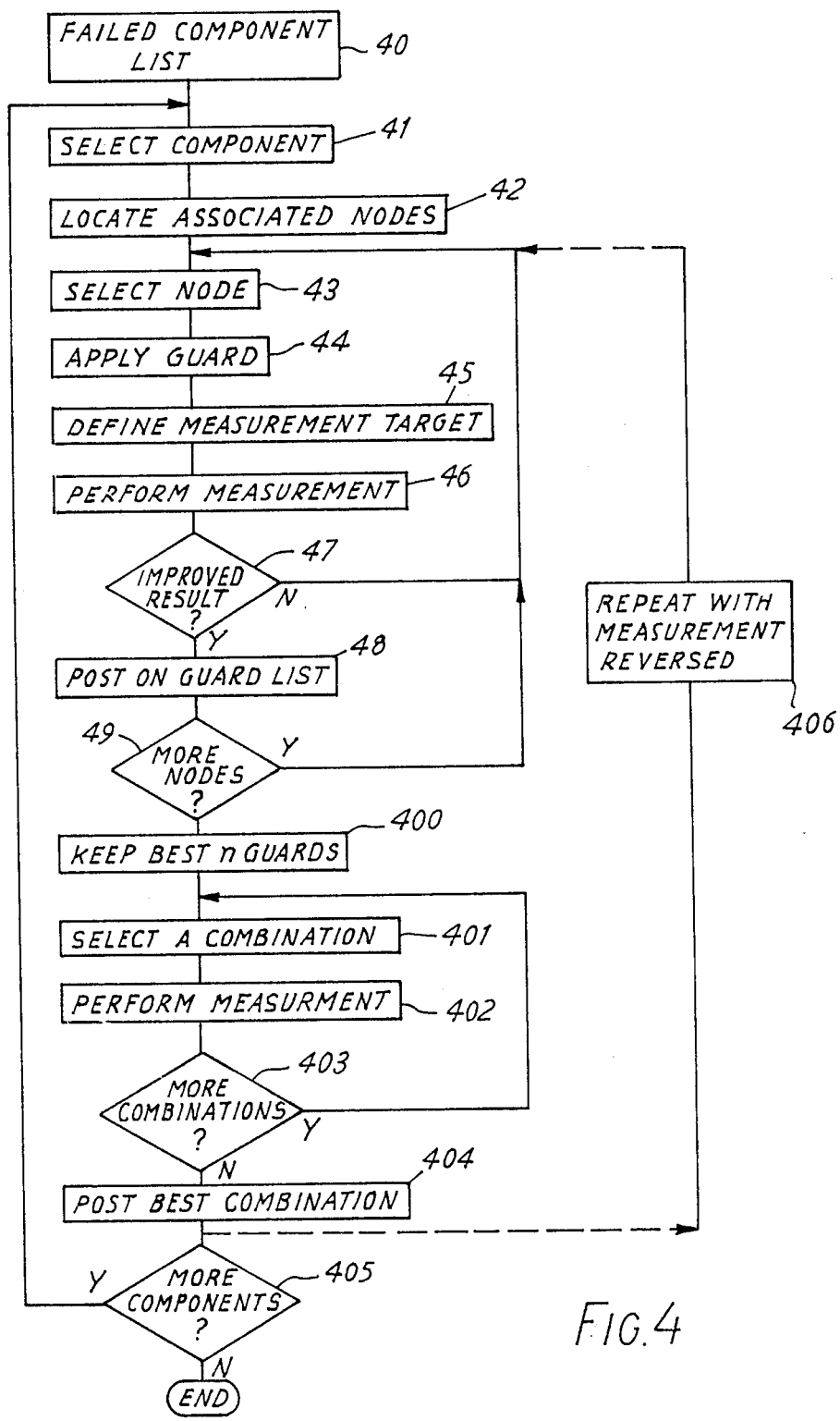
FIG. 4 represents a flow chart of guard definition.

The guard definition routine operates on the failed components list 40 (FIG. 4) to find guards which allow previously failed good components to pass. It will be appreciated that by the time the routine is entered a test for each component will have been established and a failure value or parameter available for each such component based on the present test configuration adopted. The guard definition adds guards to this configuration.

A failed component is selected 41 and circuit nodes associated with it located 42 from the stored topographical description of the circuit. One such node is selected 43 and a guard applied thereto 44. From the stored description of the component under test a measurement target may be defined 45 in accordance with the expected signal to be received as a result of the test. The test itself is then performed 46 with the new guard applied and the measurement obtained compared with the failure value. If there is an improvement 47, that is the measurement is closer to the target value than the failure value, then the guard is posted 48 as being potentially worthwhile. This is repeated 49 until all associated nodes have been considered, whereupon a number of guards yielding the greatest improvements are retained 400. The selected guards are then applied in combination to establish whether a further improvement is obtainable by simultaneous application of guards. A combination of guards is selected 401, a measurement obtained 402 and repeated 403 until all combinations have been tested. The best combination of the best guards is posted 404 for incorporation in the source test program to be compiled to allow subsequent automatic testing of that component on production boards. The process is repeated 405 until all components have been considered. Optionally the guard definition may be repeated 406 with the measurement reversed, that is with a signal injected to a previous measurement node, and a measurement made at a previous injection node.

By way of further example the operation of the method of the present invention on a particular circuit will now be considered.

Figure 5:
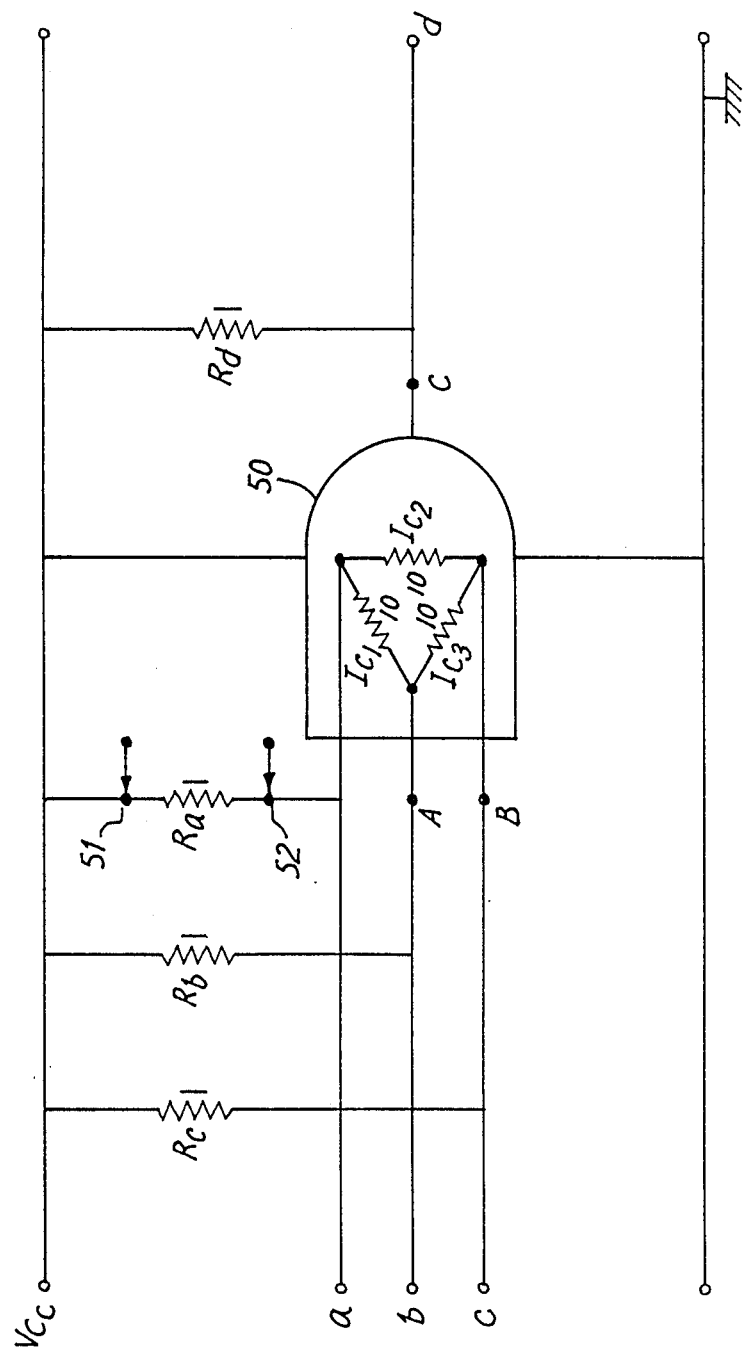
FIG. 5 represents an example fragmentary circuit under test.

In a fragment of a circuit (FIG. 5) to be automatically tested a gate 50 having three inputs a,b,c and an output d is provided as part of an integrated circuit (not shown). Having generated an automatic test sequence, component $R_a$ has been listed as failed based on a measurement between nodes 51 and 52. Since the board is known to be good, the guard definition is envoked, whereupon the ATE operation is as follows.

Following the intial test, the entry for $R_a$ in the failed component list might be:

| COMPONENT | MEASURED VALUE | TARGET VALUE | % ERROR |
|---|---|---|---|
| $R_a$ | 0.88 | 1 | 12 |

From stored circuit topography, nodes associated with the component under test are selected identifying nodes A, B and C. As previously described a guard is placed at each node in turn and a measurement with that guard in place recorded. Guards which yield an improvement are posted and, on completion of this part of the process, representative results might be:

| COMPONENT | GUARDING | MEASURED VALUE | TARGET VALUE | % ERROR | |
|---|---|---|---|---|---|
| $R_a$ | NONE | 0.88 | 1 | 12 | |
| $R_a$ | NODE A | 0.9 | 1 | 10 | - Guard Posted |
| $R_a$ | NODE B | 0.9 | 1 | 10 | - Guard Posted |
| $R_a$ | NODE C | 0.47 | 1 | 53% | - Guard Not Posted |

Following these measurements, the guards providing the best improvements may be retained. Typically four guards are retained, and the rest discarded. Since in the present example only two guards yield improvements, they are both retained.

The posted guards are now assessed to see if an improvement is available by virtue of combination of the posted guards. In this simple example the only combination remaining untried is both guards applied simultaneously. It will be appreciated however that in general a significant number of combinations may be available.

The application of guards represents a significant outlay of ATE resources, and it is desirable that the number of guards applied shall be the minimum consistent with the performance of a reliable test. To this end when combinations of more than one guard are assessed they may be penalized by applying compensation, for example by 1% for each extra guard employed. Typical results might be:

| COMPONENT | COMBINATION | GUARDING | MEASURED VALUE | TARGET VALUE | % ERROR | COMPENSATED ERROR % |
|---|---|---|---|---|---|---|
| $R_a$ | 0 | NONE | 0.88 | 1 | 12 | 12 |
| $R_a$ | 1 | NODE A | 0.9 | 1 | 10 | 10 |
| $R_a$ | 2 | NODE B | 0.9 | 1 | 10 | 10 |
| $R_a$ | 3 | A and B | 1 | 1 | 0 | 1 |

In this example, even with compensation, it is desirable that guards at nodes A and B be coupled simultaneously and both guards are posted for inclusion in the source test program when it is modified.

In the foregoing examples values have been assigned to components $R_a$, $R_b$, and $R_c$ and to the internal impedances of gate 50 $Ic_1$, $Ic_2$, and $Ic_3$. It will be realized that these values are not absolute, but that per unit values have been assigned to assist in presentation of an example.

Although apparent through straightforward circuit analysis, the basis for the results obtained above is that with no guarding a parallel path consisting of $R_b$, $R_c$ and network $Ic_1$, $Ic_2$, $Ic_3$, exists to disrupt measurement of $R_a$. With a guard at node A in place, the parallel network is reduced to $R_c$ and $Ic_2$, since no current can now flow in $R_b$. Similarly for a guard at node B $R_b$ and $Ic_1$, appear in parallel. A guard at C places $R_d$ in parallel with the $R_b$, $Rc_1$, $Ic_1$, $Ic_2$, $Ic_3$ network.

It will be appreciated that in addition to the examples of ground potential guard signals considered above, the invention is equally applicable to the placement of a guard having any signal waveform.

Other useful guards signals might be a fixed non-zero potential, or a time varying waveform where for example the dynamic performance of a device is being measured. One particularly useful time varying guard signal is a duplicate signal, for example a guard which is a duplicate of a signal appearing at one port of a component that is applied to another port to ensure no current flows through that component path.

I claim:

1. A method for defining guards during the operation of automatic test equipment so that a selected component of a suspect circuit may be tested including the steps of:
    establishing a first measurement of the selected component in a known to be good circuit of the type to be tested,
    identifying a circuit node associated with the selected component,
    applying a guard to the node,
    establishing a second measurement with the guard in place,
    and, should the guard result in an improvement, retaining that guard during subsequent automatic testing of the suspect circuit.

2. A method for defining guards as claimed in claim 1, wherein all circuit nodes associated with the selected component are identified and a guard applied to each in turn.

3. A method for defining guards as claimed in claim 1, wherein a limited number of guards are retained.

4. A method for defining guards as claimed in claim 1, wherein guards are applied in combination and further measurements performed.

5. A method for defining guards as claimed in claim 4, wherein improvement is assessed with respect to an initial reference being an unguarded or a topographically guarded measurement.

6. A method for defining guards as claimed in claim 1 wherein a guard is selected for a component for which a first measurement produces a result which is inconsistent with that expected from a sound component.

7. A method for defining guards as claimed in claim 1 wherein a second measurement is established with a plurality of guards in place and any improvement is degraded as a function of the number of guards.

8. A method for defining guards as claimed in claim 1, wherein a component measurement is established by injecting a signal at a first component node and measuring response at a second node.

9. A method for defining guards as claimed in claim 1, wherein the measurement is re-established by injecting a signal at the second node and measurement at the first node and the guarding re-applied so that the best combination is selected.

* * * * *